(12) United States Patent
Jeitner et al.

(10) Patent No.: US 7,546,766 B2
(45) Date of Patent: Jun. 16, 2009

(54) SUN SENSOR USING MID TECHNOLOGY

(75) Inventors: Wolfgang Jeitner, Ostheim (DE);
Thomas Ofenhitzer, Salz (DE)

(73) Assignee: Preh GmbH, Bad Neustadt/Saale (DE)

( * ) Notice: Subject to any disclaimer, the term of this patent is extended or adjusted under 35 U.S.C. 154(b) by 0 days.

(21) Appl. No.: 11/898,203

(22) Filed: Sep. 10, 2007

(65) Prior Publication Data

US 2008/0087079 A1    Apr. 17, 2008

Related U.S. Application Data

(63) Continuation of application No. PCT/EP2006/001725, filed on Feb. 24, 2006.

(30) Foreign Application Priority Data

Mar. 10, 2005    (DE) .................. 10 2005 011 053

(51) Int. Cl.
*G01W 1/00* (2006.01)

(52) U.S. Cl. .................. 73/170.27
(58) Field of Classification Search ........ 73/170.27; 374/141
See application file for complete search history.

(56) References Cited

U.S. PATENT DOCUMENTS

| | | | | |
|---|---|---|---|---|
| 6,087,650 | A * | 7/2000 | Dage | 250/214 AL |
| 7,325,972 | B2 * | 2/2008 | Ruettiger | 374/141 |
| 2005/0045802 | A1 | 3/2005 | Niemann et al. | |

FOREIGN PATENT DOCUMENTS

| | | |
|---|---|---|
| DE | 103 23 709 A1 | 12/2004 |
| JP | 2001-068692 A | 3/2001 |

* cited by examiner

*Primary Examiner*—Andre J Allen
(74) *Attorney, Agent, or Firm*—Muncy, Geissler, Olds & Lowe, PLLC

(57) ABSTRACT

A sensor arrangement is provided in a motor vehicle for determining solar radiation incident on the motor vehicle, having at least one electro-optic component that is fastened to a one-piece or multi-piece support using MID technology.

15 Claims, 2 Drawing Sheets

SUN SENSOR USING MID TECHNOLOGY

This nonprovisional application is a continuation of International Application No. PCT/EP2006/001725, which was filed on Feb. 24, 2006, and which claims priority to German Patent Application No. DE 102005011053, which was filed in Germany on Mar. 10, 2005, and which are both herein incorporated by reference.

BACKGROUND OF THE INVENTION

1. Field of the Invention

The present invention relates to a sensor arrangement in a motor vehicle for determining solar radiation incident on the motor vehicle.

2. Description of the Background Art

Sun sensors are frequently used in motor vehicles, where the detected incident solar radiation is used along with other means for regulating an air conditioner. In a sun sensor, electro-optic components such as, e.g., photodiodes, are oriented on a circuit board and are attached to the board in this position so as to achieve a desired spatial arrangement of the components. However, this procedure has the disadvantage that the process of orienting and fastening or contacting is very time-consuming and thus costly. Moreover, the orientation is subject to inaccuracy, causing assemblies produced in this way to have dispersions in their detection characteristics that exceed the tolerances of the components used.

SUMMARY OF THE INVENTION

It is therefore an object of the present invention to provide a sensor arrangement which does not exhibit the aforementioned disadvantages and in which the electro-optic components can be installed easily, precisely, and reproducibly.

This object is attained by a sensor arrangement that is characterized by at least one electro-optic component that is fastened to a one-piece or multi-piece support using MID technology.

The term MID (molded interconnect device) describes a technology in which conductive traces are embedded in molded parts such as, e.g., injection-molded parts. The result is three-dimensional supports that can be directly populated with components. In accordance with the present invention, these components are largely electro-optic components for detecting incident solar radiation, which can be implemented as photodiodes, solar cells, or photovoltaic cells, for example.

The use of a support employing MID technology offers the advantage that electro-optic components can be accommodated by the supports in an exact and reproducible manner. If the MID support has a multi-piece design, the sensor arrangement can be modularized, making assembly and, if necessary, maintenance of the sensor arrangement simple and inexpensive. It is possible for the sensor arrangement to be given a modular design such that the electro-optic components and other assemblies are distributed over several parts of the support and thus can be installed or replaced separately.

It is possible for the electro-optic component or components to be arranged in an inclined position relative to a flat base surface of the MID support. This makes it possible to set an angle of incidence of the component or components relative to the base surface of the support, resulting in the ability to adapt the sensor arrangement as a function of the planned installation location in the motor vehicle, for example. For instance, if the sensor arrangement is installed in the area of the instrument panel of a motor vehicle, it is possible for the base surface of the MID support to occupy a plane parallel to the instrument panel. Thus, the sensor or sensors can be oriented with respect to the instrument panel and hence also with respect to the motor vehicle.

In an embodiment, the sensor arrangement can include at least two electro-optic components on the MID support, wherein the surfaces of the electro-optic components are inclined relative to one another. The perpendiculars to the component surfaces thus are not parallel to one another. Among other things, this arrangement is distinguished by the fact that the direction of incidence of the solar radiation is easier to detect. A division of the detected area of incidence of the sunlight into sectors is accomplished, which can be analyzed with the aid of suitable analysis electronics, for example in order to determine the direction of incidence of the solar radiation.

In another embodiment, the sensor arrangement can have a terminal integrated into the MID support for accepting a plug connector or other electrical contact means. For example, this terminal has recesses that operate in conjunction with contact pins. If these contact pins are located on a circuit board, the sensor arrangement can easily be plugged onto the board. The terminal simplifies the installation or replacement of the sensor arrangement and avoids the need for an external connection means such as a plug connector attached to a cable. The sensor arrangement can be connected directly to the motor vehicle electronics by the integrated terminal, for example through a data bus of the vehicle. It is also possible for the terminal to be embodied as a part of the MID support in the form of contact pins that operate in conjunction with a board, a plug connector or another assembly. The contacts can easily be molded from the MID material itself.

In another embodiment of the invention, the MID support is of multi-piece design. Here, the individual pieces are attached to one another such that they are adjustable relative to one another. This permits exact alignment of the sensor arrangement in the motor vehicle, for example. However, the adjustment can also be performed during the operation of the sensor arrangement, for example for tracking of the electro-optic component or components. The adjustability here can be rotational as well as translational, resulting in universal adaptability in all degrees of freedom. Adjustment here is motor-driven or manual.

It is also possible for at least one temperature sensor to be arranged on the MID support. This makes it possible to measure the temperature as well as the incident solar radiation with the sensor arrangement. This information is advantageous, in particular, for controlling an air conditioner.

The sensor arrangement is advantageously characterized by additional electrical or electronic components attached to the MID support. Using these components it is possible, for example, to calibrate the electro-optic components or to process their output signals such that the sensor arrangement can be connected directly to the electronic system of the motor vehicle. It is likewise possible to fasten the MID support directly to a circuit board so as to achieve the shortest possible signal path and thus reduce or prevent possible errors in the measurement signals.

In another embodiment, the sensor arrangement has a diffuser cap located over the electro-optic component for diffusing the incident light. A diffuser cap of this type, such as is described in DE 103 23 709 A1, which is herein incorporated by reference, makes it possible, among other things, for the sunlight to strike the electro-optic component even with a shallow angle of incidence.

The MID support can have mechanical means by which the sensor arrangement can be fastened in the motor vehicle and/or by which a means such as a diffuser cap or a cover can be fastened to the sensor arrangement. Since the MID support is essentially an injection-molded part, it can be provided with mechanical means such as recesses, projections, retaining means or the like. It is thus possible to fasten the sensor arrangement to the motor vehicle without additional components and also to connect the diffuser cap or cover to the sensor arrangement. This permits further simplification of the installation and any potential repair of the sensor arrangement or parts thereof.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
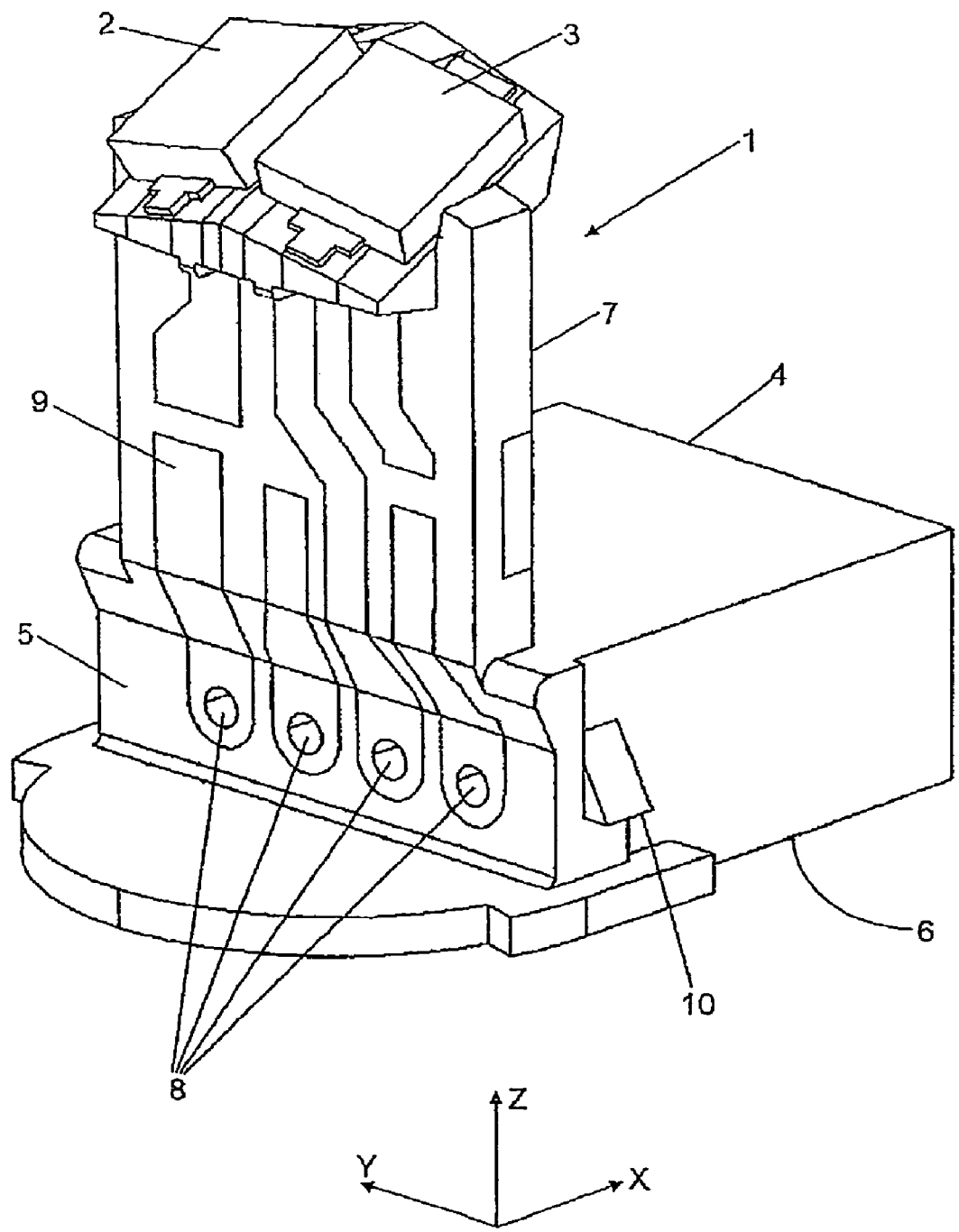
FIG. 1 illustrates a sensor arrangement in a perspective view, according to an embodiment of the present invention.

The sensor arrangement in FIG. 1 includes a support 4 in MID technology, which is provided with conductive traces 9, and two photodiodes 2 and 3. The flat base surface 6 of the MID support 4 lies parallel to the XY plane. The photodiodes 2 and 3 are arranged so as to be inclined with respect to one another, wherein an arrangement that is symmetric with respect to the XZ plane is shown in the present example. The photodiodes 2 and 3 are also arranged at an incline relative to the flat base surface 6 of the MID support 4. As a result of this spatial arrangement, which can be implemented especially efficiently by the MID support 4, improved analysis of the direction of the incident solar radiation is possible.

In an embodiment, resistors with which the photodiodes 2 and 3 can be calibrated, and which are not shown in the figure, are placed on a web 7 of the MID carrier 4. Provided in a surface 5 of the MID support 4 are recesses 8 that are necessary in order to establish a conductive transition to the back side of the MID support 4 opposite the surface 5. Contact pins that are electrically connected to conductive traces 9 on the front side by means of the walls of the recesses 8 are located there. An electrical contact with a connector, which is not shown, is provided by means of the contact pins. In this way, the sensor arrangement 1 is connected to the on-board electronics of a motor vehicle by simply plugging in a connector.

A cover, which is not shown, can be placed on the sensor arrangement 1 by means of the projections 10. Also not shown are other recesses or projections by means of which the sensor arrangement is fastened in its location of use.

Figure 2:
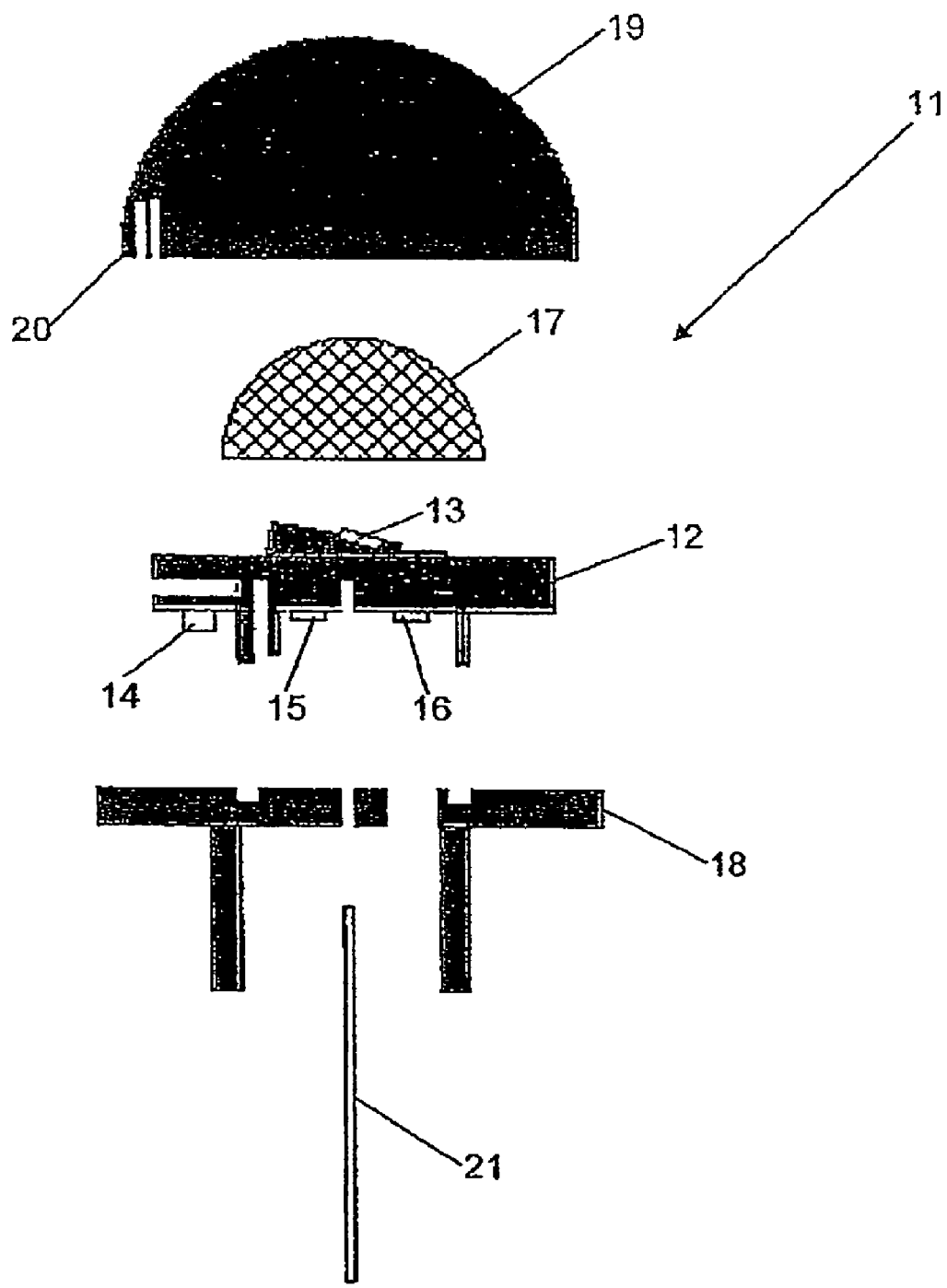
FIG. 2 illustrates an exploded view of another sensor arrangement.

FIG. 2 shows an exploded view of another sensor arrangement 11. The MID support 12 is populated with a photodiode 13, a temperature sensor 14 and resistors 15 and 16. The MID support 12 has projections, not shown, into which a diffuser cap 17 is clipped. This ensures simple assembly and maintenance that requires few or no tools.

The MID support 12 is fastened into a housing 18 and is protected by a cover 19. The latter has ventilation slots 20 by means of which the temperature sensor 14 is in thermal contact with the environment. Contact pins 21 with which an electrical connection to the MID support 12 is established are pushed through the housing 18.

Naturally, components such as the temperature sensor 14, the resistors 15 and 16, or the diffuser cap 17 can be omitted without departing from the inventive concept.

The invention is not limited to the design forms shown in the example embodiment. In particular, this applies to the type, number, and spatial arrangement of the electro-optic components. Moreover, the MID support can be populated with additional electrical or electronic components or assemblies, for example signal amplifiers, analog-to-digital converters, or additional sensors.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor arrangement in a motor vehicle for determining solar radiation incident on the motor vehicle, the sensor arrangement comprising at least one electro-optic component that is fastened to a one-piece or multi-piece support using MID molded interconnect device technology, wherein the electro-optic component is arranged in an inclined position relative to a flat base surface of the MID support.

2. The sensor arrangement according to claim 1, further comprising at least two electro-optic components on the MID support, wherein the surfaces of the electro-optic components are inclined relative to one another.

3. The sensor arrangement according to claim 1, further comprising a terminal integrated into the MID support for accepting a plug connector or other electrical contact means.

4. The sensor arrangement according to claim 1, wherein, in a multi-piece design of the MID support, the pieces are attached to one another such that they are adjustable relative to one another.

5. The sensor arrangement according to claim 1 further comprising at least one temperature sensor being provided on the MID support.

6. The sensor arrangement according to claim 1, further comprising additional electrical or electronic components being attached to the MID support.

7. The sensor arrangement according to claim 1, further comprising a diffuser cap being provided over the electro-optic component for diffusing the incident light.

8. The sensor arrangement according to claim 1, wherein the MID support has mechanical means by which the sensor arrangement is fastened in the motor vehicle and/or by a diffuser cap or a cover is fastened to the sensor arrangement.

9. A sensor arrangement in a motor vehicle for determining solar radiation incident on the motor vehicle, the sensor arrangement comprising at least two electro-optic components fastened to a one-piece or multi-piece support using MID technology, wherein the surfaces of the electro-optic components are inclined relative to one another.

10. The sensor arrangement according to claim 9, further comprising a terminal integrated into the MID support for accepting a plug connector or other electrical contact means.

11. The sensor arrangement according to claim 9, wherein, in a multi-piece design of the MID support, the pieces are attached to one another such that they are adjustable relative to one another.

12. The sensor arrangement according to claim 9, further comprising at least one temperature sensor being provided on the MID support.

13. The sensor arrangement according to claim 9, further comprising additional electrical or electronic components being attached to the MID support.

14. The sensor arrangement according to claim 9, further comprising a diffuser cap being provided over the electro-optic component for diffusing the incident light.

15. The sensor arrangement according to claim 9, wherein the MID support has mechanical means by which the sensor arrangement is fastened in the motor vehicle and/or by a diffuser cap or a cover is fastened to the sensor arrangement.

* * * * *

UNITED STATES PATENT AND TRADEMARK OFFICE
CERTIFICATE OF CORRECTION

PATENT NO. : 7,546,766 B2
APPLICATION NO. : 11/898203
DATED : June 16, 2009
INVENTOR(S) : Jeitner et al.

Page 1 of 1

It is certified that error appears in the above-identified patent and that said Letters Patent is hereby corrected as shown below:

Title Page,
Change item

(75) Inventors:  Wolfgang Jeitner, Ostheim (DE)
                  Thomas Ofenhitzer, Salz (DE)

To:

(75) Inventors:  Martin Jeitner, Ostheim (DE)
                    Thomas Ofenhitzer, Salz (DE)

Signed and Sealed this

Twenty-eighth Day of July, 2009

JOHN DOLL
*Acting Director of the United States Patent and Trademark Office*